(12) United States Patent
Yamada et al.

(10) Patent No.: US 11,391,796 B2
(45) Date of Patent: Jul. 19, 2022

(54) OPTICALLY PUMPED MAGNETOMETER AND MAGNETIC SENSING METHOD THAT EXPAND A MEASURABLE FREQUENCY BAND OF MAGNETISM

(71) Applicant: HAMAMATSU PHOTONICS K.K., Hamamatsu (JP)

(72) Inventors: Masaki Yamada, Hamamatsu (JP); Koji Takemiya, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 0 days.

(21) Appl. No.: 17/189,530

(22) Filed: Mar. 2, 2021

(65) Prior Publication Data
US 2021/0278486 A1    Sep. 9, 2021

(30) Foreign Application Priority Data
Mar. 4, 2020  (JP) .............................. JP2020-036727

(51) Int. Cl.
*G01R 33/26*    (2006.01)

(52) U.S. Cl.
CPC .................................. *G01R 33/26* (2013.01)

(58) Field of Classification Search
CPC ....... G01R 33/26; G01R 33/02; G01R 33/032
See application file for complete search history.

(56) References Cited

U.S. PATENT DOCUMENTS

| 2014/0320123 | A1* | 10/2014 | Kobayashi | G01R 33/26 324/244.1 |
|---|---|---|---|---|
| 2015/0022200 | A1* | 1/2015 | Ichihara | G01R 33/26 324/304 |
| 2016/0061913 | A1* | 3/2016 | Kobayashi | G01R 33/26 324/305 |

FOREIGN PATENT DOCUMENTS

| JP | 2014-215151 A | 11/2014 | |
|---|---|---|---|
| JP | 2015-004677 A | 1/2015 | |
| JP | WO2015015628 A1 * | 3/2017 | ........... G01N 24/006 |
| JP | 6222974 B2 | 11/2017 | |

* cited by examiner

*Primary Examiner* — Jay Patidar
(74) *Attorney, Agent, or Firm* — Faegre Drinker Biddle & Reath LLP

(57) ABSTRACT

A optically pumped magnetometer includes a cell filled with an alkali metal; a pump light source that generates a pump light; a probe light source that generates a probe light; a signal output unit that obtains an output signal related to magnetism, which is received by the cell, based on the probe light which has passed through the cell; a coil unit that generates a static magnetic field along a pump optical axis in a region of disposition of the cell; and a computer that controls operation of the coil unit. The computer outputs a first control signal to set an intensity of the static magnetic field to a first intensity, and a second control signal to set the intensity of the static magnetic field to a second intensity different from the first intensity.

8 Claims, 11 Drawing Sheets

OPTICALLY PUMPED MAGNETOMETER AND MAGNETIC SENSING METHOD THAT EXPAND A MEASURABLE FREQUENCY BAND OF MAGNETISM

TECHNICAL FIELD

The present invention relates to a optically pumped magnetometer and a magnetic sensing method.

BACKGROUND

A optically pumped magnetometer using optical pumping detects spin polarization of an atom of an alkali metal which is excited by the optical pumping, to measure very small magnetism. The optically pumped magnetometer draws attention as a new magnetic measurement technique that replaces a super conducting quantum interference device (SQUID). For example, Japanese Unexamined Patent Publication No. 2014-215151 discloses a magnetometer using optical pumping.

SUMMARY

The optically pumped magnetometer irradiates the alkali metal in a vapor phase with a pump light to bring the alkali metal into an excited state. The alkali metal in an excited state is in a spin polarized state. When the alkali metal in a spin polarized state receives magnetism, the inclination of a spin polarization axis of the atom of the alkali metal changes according to the received magnetism. The inclination of the spin polarization axis can be detected by a probe light with which the alkali metal in a vapor phase is irradiated separately from the pump light.

A change in magnetism received by the alkali metal in an excited state appears as a change in rotation angle of the spin polarization axis. The change in rotation angle of the spin polarization axis can be detected as a change in polarization angle of the probe light. Therefore, the optically pumped magnetometer outputs the detected change in polarization angle as the intensity of a signal. The larger a change in magnetic intensity is, the larger a change in rotation angle of the spin polarization axis is. As a result, the intensity of the signal output by the optically pumped magnetometer also increases.

The intensity of the signal output by the optically pumped magnetometer is affected by not only the intensity of magnetism but also the frequency of magnetism. Even if the intensity of magnetism is the same, the intensity of the signal output by the optically pumped magnetometer increases or decreases when the frequency of magnetism differs. Therefore, the intensity of the signal may be sufficient depending on the frequency of magnetism. Contrarily, the intensity of the signal may not be sufficient depending on the frequency of magnetism. As a result, the frequency band of magnetism which is measurable in a state where a sufficient S/N ratio is maintained is limited.

The present invention provides a optically pumped magnetometer and a magnetic sensing method capable of expanding the measurable frequency band of magnetism.

According to one form of the present invention, there is provided a optically pumped magnetometer including: a cell filled with an alkali metal; a first light source that generates a pump light to excite an atom of the alkali metal; a second light source that generates a probe light to detect a desired characteristic of the atom in an excited state; a signal output unit that obtains an output signal related to magnetism, which is received by the cell, based on the probe light which has passed through the cell; a static magnetic field generating unit that generates a static magnetic field along an optical axis of the first light source in a region in which the cell is disposed; and a control unit that controls operation of the static magnetic field generating unit. The control unit outputs a first control signal to set an intensity of the static magnetic field to a first intensity, and a second control signal to set the intensity of the static magnetic field to a second intensity different from the first intensity.

The static magnetic field generating unit of the optically pumped magnetometer generates the static magnetic field in the region in which the cell is disposed. The frequency of precession of the atom of the alkali metal which is vaporized and excited by the pump light is determined according to the intensity of the static magnetic field. As a result, since a precession having a frequency according to the first intensity is generated, magnetism corresponding to the frequency of the precession can be satisfactorily detected. Further, the control unit switches the intensity of the static magnetic field from the first intensity to the second intensity. As a result of switching the intensity, since the frequency of the precession changes according to the second intensity, also the magnetism which can be satisfactorily detected changes. Therefore, the control unit switches the intensity of the static magnetic field, so that the frequency band of magnetism which can be satisfactorily detected can be switched. Therefore, the optically pumped magnetometer can expand the measurable frequency band of magnetism.

In one form, the control unit may alternately output the first control signal and the second control signal. According to the aspect, the measurable frequency band of magnetism can be expanded by simple control.

In one form, the control unit may output a third control signal to set the intensity of the static magnetic field to a third intensity different from the first intensity and the second intensity. The control unit may repeat an operation of outputting the first control signal, the second control signal, and the third control signal in order. According to the aspect, the measurable frequency band of magnetism can be further expanded.

In one form, the control unit may output a third control signal to set the intensity of the static magnetic field to a third intensity different from the first intensity and the second intensity. The control unit may repeat an operation of outputting the first control signal, the second control signal, the third control signal, the second control signal, and the first control signal in order. Also according to the aspect, the measurable frequency band of magnetism can be further expanded.

In one form, the control unit may repeat a first operation of determining whether or not the output signal which is obtained in a state where the first control signal is output contains a signal component indicating a magnetic pulse, and a second operation of determining whether or not the output signal which is obtained in a state where the second control signal is output contains a signal component indicating a magnetic pulse. When in the first operation, the output signal contains the signal component indicating the magnetic pulse, the first operation may be continued without switching from the first operation to the second operation. When in the second operation, the output signal contains the signal component indicating the magnetic pulse, the second operation may be continued without switching from the second operation to the first operation. According to the aspect, the state of the static magnetic field in which the magnetic pulse is confirmed continues, so that the static magnetic field suitable for measuring the magnetic pulse can be generated in the region in which the cell is disposed. Therefore, the sensitivity of measurement of the magnetic pulse can be further improved.

According to another form of the present invention, there is provided a magnetic sensing method including: a step of irradiating a cell, which is filled with an alkali metal, with a pump light to excite an atom of the alkali metal, and irradiating the cell with a probe light to detect a desired characteristic of the atom in an excited state; a step of acquiring an output signal based on the probe light which has passed through the cell in a state where a static magnetic field having a first intensity is generated in a region in which the cell is disposed; and a step of acquiring an output signal based on the probe light which has passed through the cell in a state where a static magnetic field having a second intensity different from the first intensity is generated in the region in which the cell is disposed.

In the method, the intensity of the static magnetic field is switched and measurement is performed, so that the frequency band of magnetism which can be satisfactorily detected is switched. As a result, the measurable frequency band of magnetism can be expanded.

According to the present invention, the optically pumped magnetometer and the magnetic sensing method capable of expanding the measurable frequency band of magnetism are provided.

BRIEF DESCRIPTION OF THE DRAWINGS

FIGS. 6A, 6B, and 6C are graphs for describing a specific operation of the optically pumped magnetometer illustrated in FIG. 1.

DETAILED DESCRIPTION

Hereinafter, modes for carrying out the present invention will be described in detail with reference to the accompanying drawings. In the description of the drawings, the same elements will be denoted by the same reference signs, and duplicated descriptions will be omitted.

Figure 1:
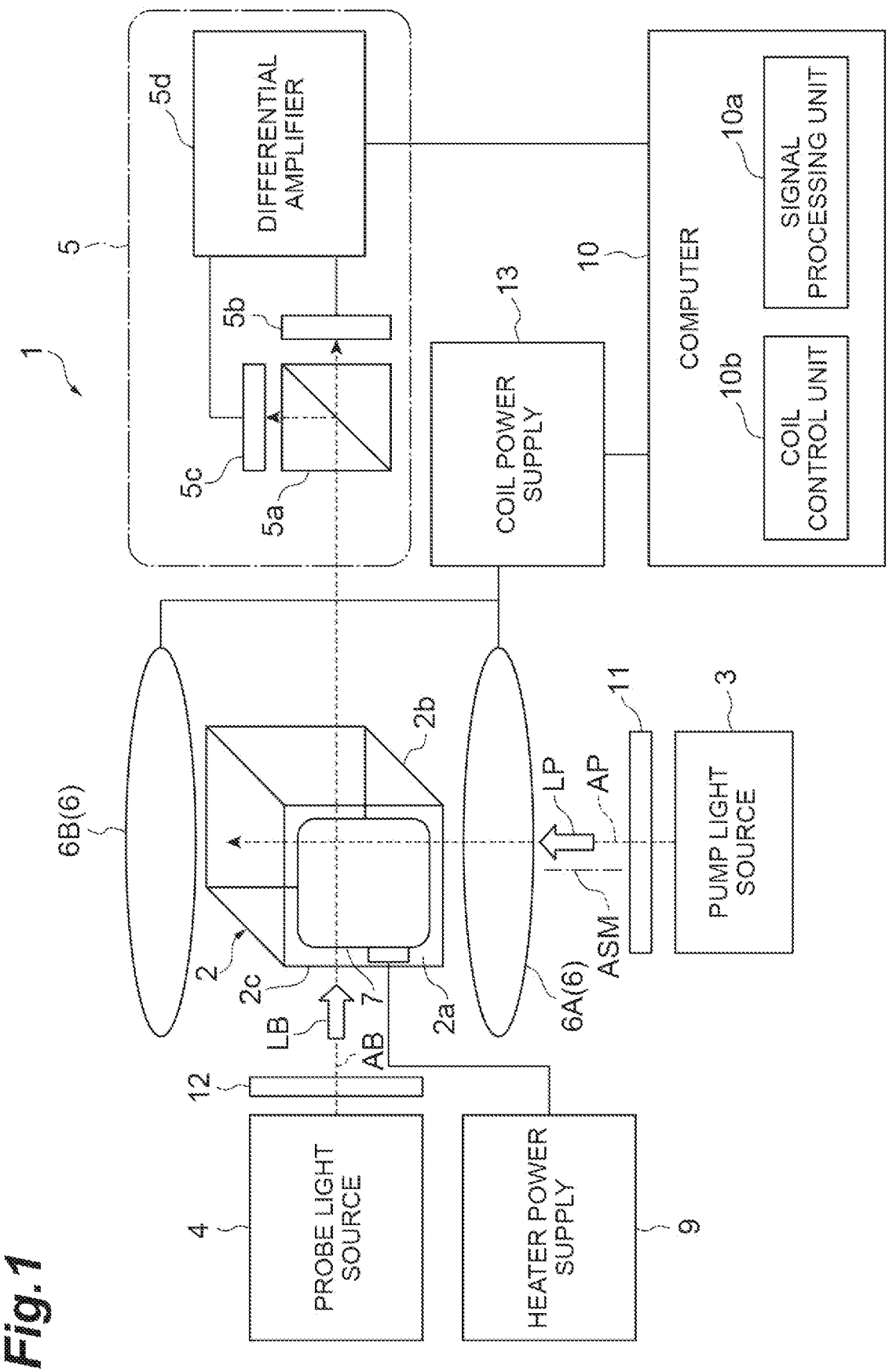
FIG. 1 is a diagram illustrating a configuration of a optically pumped magnetometer of an example.
Figure 2:
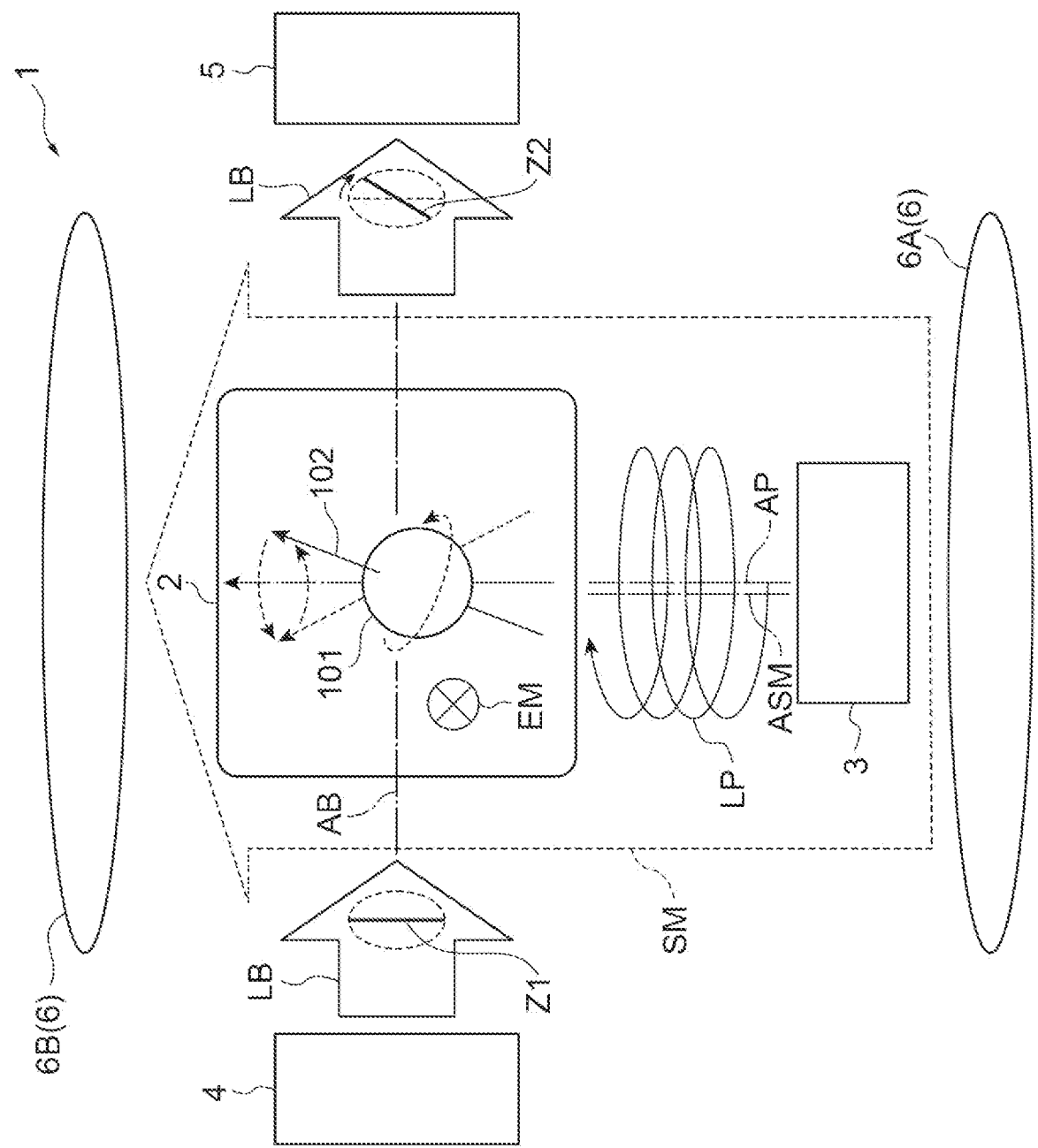
FIG. 2 is a view for describing an operation of the optically pumped magnetometer illustrated in FIG. 1.

As illustrated in FIGS. 1 and 2, a optically pumped magnetometer 1 includes a cell 2, a pump light source 3 (first light source), a probe light source 4 (second light source), a signal output unit 5, a coil unit 6 (static magnetic field generating unit), and a computer 10 (control unit).

The cell 2 is a filling container made of glass. As the glass material forming the cell 2, for example, quartz, sapphire, silicon, Kovar glass, and borosilicate glass (Pyrex (registered trademark) glass) may be adopted. Particularly, the transmission coefficient of helium (He) in Kovar glass is an order of magnitude lower than the transmission coefficient of helium (He) in Pyrex (registered trademark) glass. Therefore, the thickness of the cell 2 can be reduced, so that the above materials are beneficial to reducing the size of the cell 2. Such materials can satisfactorily transmit a pump light LP and a probe light LB to be described later. As the material of the cell 2, a material having optical transparency for the pump light LP and the probe light LB may be adopted.

A heater 7 is attached to the cell 2. The heater 7 generates heat according to a current supplied from a heater power supply 9. The heater 7 generates vapor of an alkali metal contained in the cell 2. The heater 7 controls the internal temperature of the cell 2. As a result, the vapor density of the alkali metal with which the cell 2 is filled is controlled. The heater 7 is attached to a side surface 2a of the cell 2. The pump light LP and the probe light LB are not incident on the side surface 2a.

The cell 2 contains the vapor of the alkali metal and a filling gas. The alkali metal contained in the cell 2 is potassium (K). Lithium (Li), sodium (Na), rubidium (Rb), and cesium (Cs) may be adopted as the alkali metal. The alkali metal may include at least one or more of these metals. For example, only potassium may be adopted as the alkali metal. The spin-destruction collision relaxation rate of potassium is relatively small among the alkali metals used in the optically pumped magnetometer. For example, the spin-destruction collision relaxation rate of potassium is smaller than the spin-destruction collision relaxation rate of cesium or rubidium. Therefore, a optically pumped magnetometer using a cell filled with potassium has higher sensitivity than a optically pumped magnetometer using cesium or rubidium. It is preferable that an alkali metal with a smaller atomic number is used for higher sensitivity. Potassium and another alkali metal may be adopted in combination as the alkali metal.

The filling gas controls the vapor of the alkali metal. More specifically, the filling gas controls the relaxation of spin polarization of the vapor of the alkali metal. The filling gas protects the vapor of the alkali metal. The filling gas suppresses light emission which becomes noise. It is preferable that an inert gas is used as the filling gas. For example, helium (He), neon (Ne), argon (Ar), krypton (Kr), xenon (Xe), nitrogen ($N_2$), and hydrogen ($H_2$) may be adopted as the raw material of the inert gas.

The pump light source 3 generates the pump light LP. The pump light source 3 is, for example, a laser device. The wavelength of the pump light LP depends on the type of an atom forming the vapor of the alkali metal. More specifically, the wavelength of the pump light LP depends on the wavelength of an absorption line of the atom forming the vapor of the alkali metal. For example, when potassium is adopted as the alkali metal and a D1 absorption line is used, the wavelength of the pump light LP is 770.1 nanometers. The vapor of the alkali metal contained in the cell 2 absorbs the pump light LP. The vapor of the alkali metal which has absorbed the pump light LP forms a predetermined spin state. The pump light source 3 emits the pump light LP in the direction of a pump optical axis AP via a pump optical system 11. The pump optical system 11 includes, for example, a ¼ wavelength plate. The pump optical axis AP intersects a side surface 2b of the cell 2. The side surface 2b is different from the side surface 2a on which the heater 7 is provided.

The probe light source 4 generates the probe light LB. The probe light source 4 is, for example, a laser device. The wavelength of the probe light LB depends on the type of the atom forming the vapor of the alkali metal. More specifically, the wavelength of the probe light LB depends on the wavelength of the absorption line of the atom forming the vapor of the alkali metal. For example, when potassium is adopted as the alkali metal, the wavelength of the probe light LB is slightly detuned from 770.1 nanometers which is the wavelength of the pump light LP. The absorption of the probe light LB by the alkali metal is suppressed by the detuning. When the probe light LB passes through the vapor of the alkali metal, the probe light LB is affected by the state of spin polarization of the atom of the alkali metal. More specifically, a polarization angle Z1 of the probe light LB before the probe light LB passes through the vapor of the alkali metal is changed to a polarization angle Z2 when the probe light LB passes through the vapor of the alkali metal (refer to FIG. 2). The state of spin polarization can be found out by detecting a change in polarization angle. The probe light source 4 emits the probe light LB in the direction of a probe optical axis AB via a probe optical system 12. The probe optical system 12 includes, for example, a ½ wavelength plate. The probe optical axis AB intersects the pump optical axis AP. For example, the probe optical axis AB is orthogonal to the pump optical axis AP. The probe optical axis AB intersects a side surface 2c of the cell 2. The side surface 2c is different from the side surface 2a on which the heater 7 is provided, and the side surface 2b intersecting the pump optical axis AP.

The signal output unit 5 acquires the intensity of the probe light LB that has passed through the cell 2. The signal output unit 5 outputs the acquired intensity to the computer 10. The probe light LB which has passed through the cell 2 contains information indicating the state of the excited atom of the alkali metal. More specifically, the probe light LB which has passed through the cell 2 contains information on a desired characteristic in an excited state of the atom of the alkali metal. For example, the probe light LB which has passed through the cell 2 contains information on spin polarization of the atom of the alkali metal, which is in an excited state. In addition, for example, the probe light LB which has passed through the cell 2 contains information on a displacement of a spin polarization axis of the atom of the alkali metal, which is in an excited state. The signal output unit 5 includes a polarization beam splitter 5a, a first photodiode 5b, a second photodiode 5c, and a differential amplifier 5d. The polarization beam splitter 5a outputs a first light component to the first photodiode 5b. The first light component has a first polarization angle contained in the probe light LB. The first photodiode 5b generates a signal according to the intensity of the first light component. The first photodiode 5b inputs the signal, which is generated according to the intensity of the first light component, to the differential amplifier 5d.

The polarization beam splitter 5a outputs a second light component having another polarization angle from a second output surface. For example, the first polarization angle is the polarization angle of the probe light LB emitted from the probe light source 4. The first polarization angle is the polarization angle of the probe light LB before the probe light LB passes through the cell 2. The second light component is generated when the probe light LB passes through the vapor of the alkali metal. The second light component contains information indicating the state of the excited atom of the alkali metal. In other words, the second light component contains information indicating a desired characteristic of the excited atom of the alkali metal. The second light component is incident on the second photodiode 5c. The second photodiode 5c generates a second light signal according to the intensity of the second light component. The second photodiode 5c inputs the second light signal to the differential amplifier 5d.

The differential amplifier 5d receives the light signals input from the first photodiode 5b and the second photodiode 5c. The differential amplifier 5d obtains a difference between the light signal received from the first photodiode 5b and the light signal received from the second photodiode 5c. The differential amplifier 5d generates an output signal according to the difference between the light signals. The differential amplifier 5d inputs the output signal to the computer 10.

The coil unit 6 generates a static magnetic field SM (refer to FIG. 2) in a region where the cell 2 is disposed. The coil unit 6 includes a pair of coils 6A and 6B. The pair of coils 6A and 6B are disposed to interpose the cell 2 therebetween. The pair of coils 6A and 6B generate the static magnetic field SM in the region of disposition of the cell 2 between the pair of coils 6A and 6B. The direction of the static magnetic field SM is, for example, from a first coil 6A to a second coil 6B. The direction of the static magnetic field SM generated by the coil unit 6 is defined as a static magnetic field axis ASM. The direction of the static magnetic field axis ASM is the same as the direction of the pump optical axis AP. The static magnetic field axis ASM is parallel to the pump optical axis AP. The static magnetic field axis ASM intersects the probe optical axis AB. The direction of the static magnetic field SM does not change over elapse of time. Incidentally, the meaning of "static magnetic field" in the present example is that the intensity of the magnetic field is allowed to change in a stepwise manner and/or continuously over elapse of time.

Incidentally, the static magnetic field generating unit is not limited to the coils 6A and 6B as long as the static magnetic field generating unit can have a function of switching the intensity of the magnetic field generated.

The coil unit 6 generates the static magnetic field SM according to a direct current supplied from a coil power supply 13. The intensity of the static magnetic field SM generated by the coil unit 6 depends on the current supplied from the coil power supply 13. The coil power supply 13 outputs a predetermined current to the coil unit 6 according to a control signal output from the computer 10. The intensity of the static magnetic field SM generated by the coil unit 6 will be described in detail later.

The computer 10 physically includes memories such as a RANI and a ROM, a processor (arithmetic circuit) such as a CPU, a communication interface, and a storage unit such as a hard disk. The computer 10 is, for example, a personal computer, a cloud server, or a smart device such as a smartphone or a tablet terminal. The computer 10 causes the CPU of a computer system to execute a program, which is stored in the memory, to exhibit the function.

The computer 10 includes a signal processing unit 10a and a coil control unit 10b as functional components. The signal processing unit 10a uses a differential signal input from the differential amplifier 5d, to obtain information on magnetism received by the cell 2. The information on magnetism is information on magnetism to be measured by the optically pumped magnetometer 1, and does not contain information on magnetism generated by the coil unit 6. The coil control unit 10b outputs a control signal. The control signal output by the coil control unit 10b controls the magnitude of a current supplied from the coil power supply 13 to the coil unit 6. The coil control unit 10b may output a control signal based on a sequence set in advance. The coil control unit 10b may use a processing result of the signal processing unit 10a to output a control signal. The computer 10 may control operation of the pump light source 3 and operation of the probe light source 4.

Hereinafter, the measurement principle of the optically pumped magnetometer 1 including the coil unit 6 will be described with reference to FIG. 2 and the like. When an atom 101 of the alkali metal absorbs the pump light LP, a rotation axis 102 faces a predetermined direction. The precession of the atom 101 of the alkali metal is generated due to the static magnetic field SM applied from the outside. The precession is known as Larmor precession. The angular frequency of the Larmor precession is called Larmor frequency.

Figure 3:
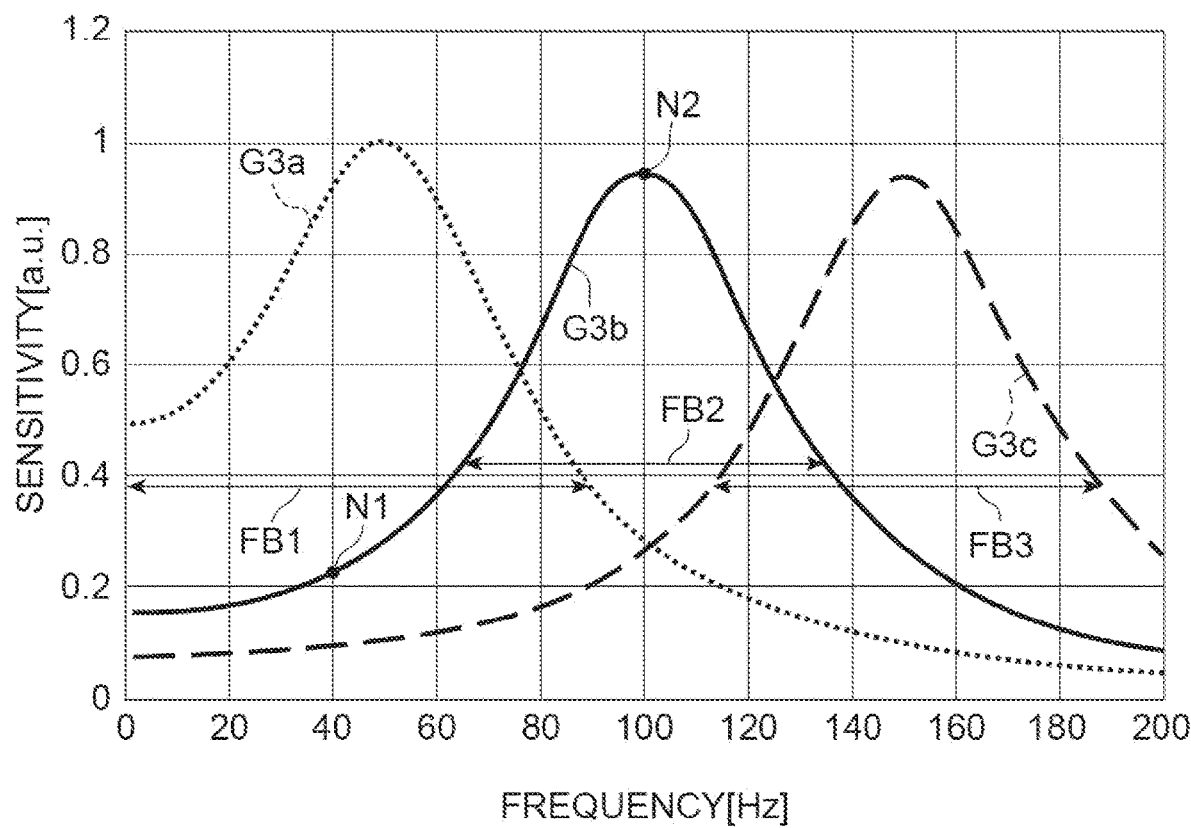
FIG. 3 is a graph for describing the reason that the measurable frequency band of magnetism can be expanded.

For example, when a measurement target is generated, and the frequency of magnetism EM input to the cell 2 is close to the Larmor frequency, a resonance phenomenon occurs. FIG. 3 shows a relationship between the frequency of the magnetism EM input to the cell 2 and the intensity of a signal output by the signal output unit 5. The horizontal axis represents the frequency of the magnetism EM. The vertical axis represents sensitivity which is the intensity of the signal output by the signal output unit 5. The Larmor frequency of the atom 101 differs between lines G3a, G3b, and G3c. The intensity of the static magnetic field SM generated by the coil unit 6 differs between the lines G3a, G3b, and G3c. For example, the line G3a indicates a frequency characteristic when the intensity of the static magnetic field SM is set to a first intensity. The line G3b indicates a frequency characteristic when the intensity of the static magnetic field SM is set to a second intensity. The line G3c indicates a frequency characteristic when the intensity of the static magnetic field SM is set to a third intensity. The second intensity is larger than the first intensity. The third intensity is larger than the second intensity. When the intensity of the static magnetic field SM differs, the resonant frequency which causes the peak of intensity differs. For example, when the intensity of the static magnetic field SM increases, the resonant frequency increases. The relationship shown by the lines G3a, G3b, and G3c of FIG. 3 can be described as a Lorentz distribution in which the peak of intensity occurs at the resonant frequency. The relationship shown by the lines G3a, G3b, and G3c can be controlled by the intensity of the static magnetic field SM generated by the coil unit 6. The reason is that the resonant frequency of the atom 101 for the frequency of magnetism is proportional to the intensity of the static magnetic field SM.

For example, when the intensity of the static magnetic field SM is fixed to the second intensity (line G3b), the frequency having a sensitivity of 0.4 or more is from approximately 60 Hz to 140 Hz. A band FB2 of the frequency is approximately 80 Hz.

Figure 4A:
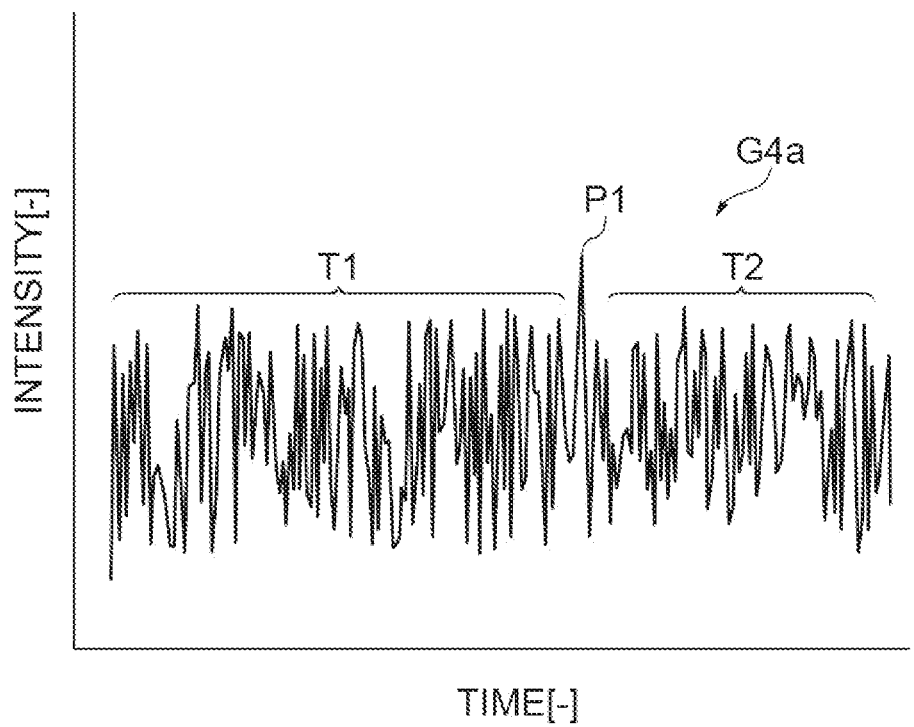
FIG. 4A shows an example of an output signal that is obtained when the frequency of a magnetic pulse and a resonant frequency deviate from each other.
Figure 4B:
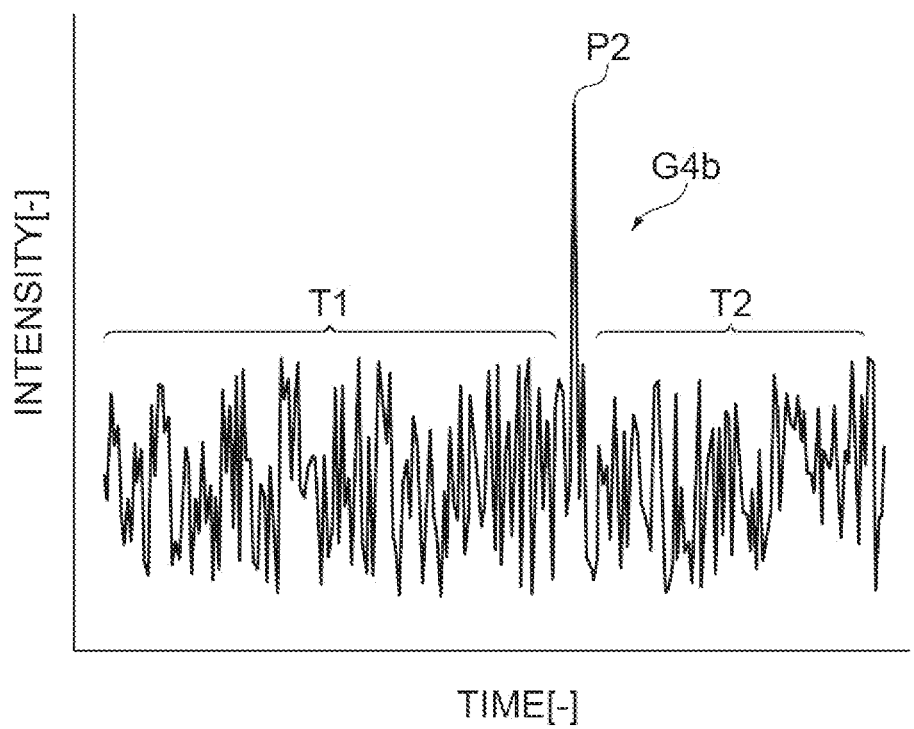
FIG. 4B shows an example of an output signal that is obtained when the frequency of a magnetic pulse and the resonant frequency approximate to each other.

FIGS. 4A and 4B are examples of an output signal output by the signal output unit 5. The horizontal axis represents time. The vertical axis represents the intensity of the output signal. An output signal G4a contains a predetermined noise at periods T1 and T2 where there is no input of the magnetism EM. When the magnetism EM having a pulse shape is input, a signal component P1 appears. When the frequency of the magnetism EM having a pulse shape is far from the resonant frequency, the sensitivity of the signal component P1 is weak (refer to a point N1 on the line G3b of FIG. 3). Therefore, the signal component P1 is buried in noise. In other words, the S/N ratio which is the ratio of the intensity of noise and the intensity of the signal component is small.

By the way, it can be also considered that for data in which the signal component P1 is buried in noise, measurement is performed multiple times and then an averaging process is performed to emphasize the signal component P1 (improve the S/N ratio). When the magnetism EM having a pulse shape appears in a period and conditions which are roughly determined, a plurality of data can be acquired. Therefore, the data can be dealt with by the averaging process. However, when the appearance of the magnetism EM having a pulse shape is accidental, the appearance of the magnetism EM cannot be predicted. Therefore, it is very difficult to obtain a plurality of data for the averaging process.

On the other hand, as shown in FIG. 4B, when the frequency of the magnetism EM having a pulse shape is close to the resonant frequency, the intensity of a signal component P2 is strong (refer to a point N2 on the line G3b of FIG. 3). Therefore, the signal component P2 is not buried in noise. In other words, the S/N ratio which is the ratio of the intensity of noise and the intensity of the signal component increases. The optically pumped magnetometer 1 of the present example can perform measurement with an increased S/N ratio without requiring an averaging process.

As described above, when the intensity of the static magnetic field SM is fixed to the second intensity (line G3b), the band FB2 is approximately 80 Hz. Therefore, the intensity of the static magnetic field SM is sequentially switched from the first intensity to the second intensity, and then to the third intensity. Then, the band having a sensitivity of 0.4 or more is expanded. Specifically, the band is a union of a band FB1 (from 0 Hz to 90 Hz) in the case of the first intensity (line G3a), a band FB2 (from 60 Hz to 140 Hz) in the case of the second intensity (line G3b), and a band FB3 (from 110 Hz to 190 Hz) in the case of the third intensity (line G3c). The bandwidth is approximately 190 Hz as a whole. Therefore, the sensitivity can be maintained at a predetermined value (for example, 0.4 or more) by sequentially switching the intensity of the static magnetic field SM from the first intensity to the second intensity, and then to the third intensity. In the present example, the maintaining of the sensitivity (intensity) at a value set in advance or more is defined as "being measurable". Then, the range of the frequency at which the sensitivity can be maintained at the value set in advance or more is defined as the "measurable frequency band of magnetism".

Figure 5:
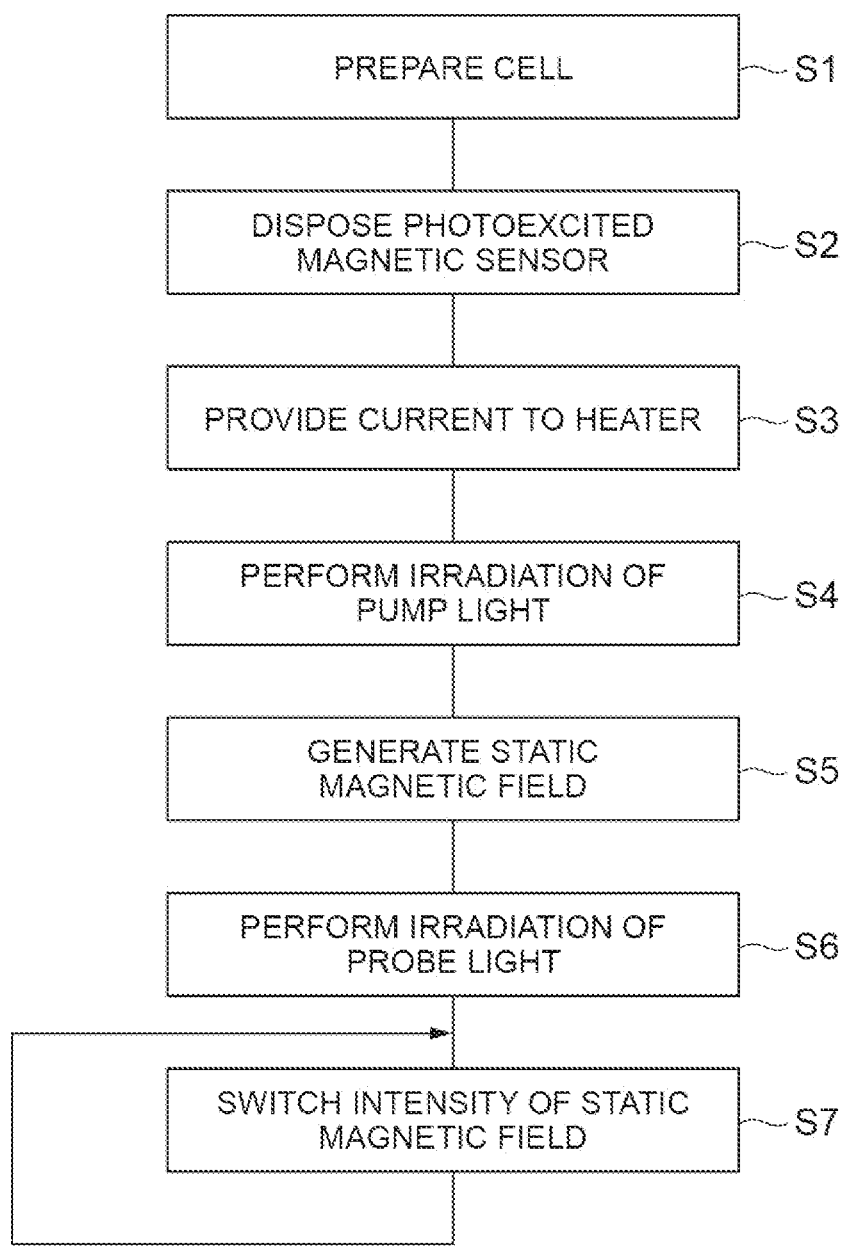
FIG. 5 is a flowchart illustrating main steps of a magnetic sensing method of the example.

Next, a magnetic sensing method performed by the optically pumped magnetometer 1 will be described with reference to FIG. 5. First, the cell 2 is prepared (step S1). Specifically, the cell 2 is filled with a predetermined alkali metal and a filling gas. The cell 2 is disposed between the coils 6A and 6B. The optically pumped magnetometer 1 is disposed at a predetermined position with respect to a measurement object (step S2).

When the disposition of the device is completed, the computer 10 provides a control signal to cause the heater power supply 9 to output a current (step S3). As a result, since the current is provided to the heater 7, the temperature of the heater 7 rises. Vapor of the alkali metal is generated in the cell 2. Next, the computer 10 controls the pump light source 3 to start irradiation of the pump light LP (step S4).

Figure 6A:
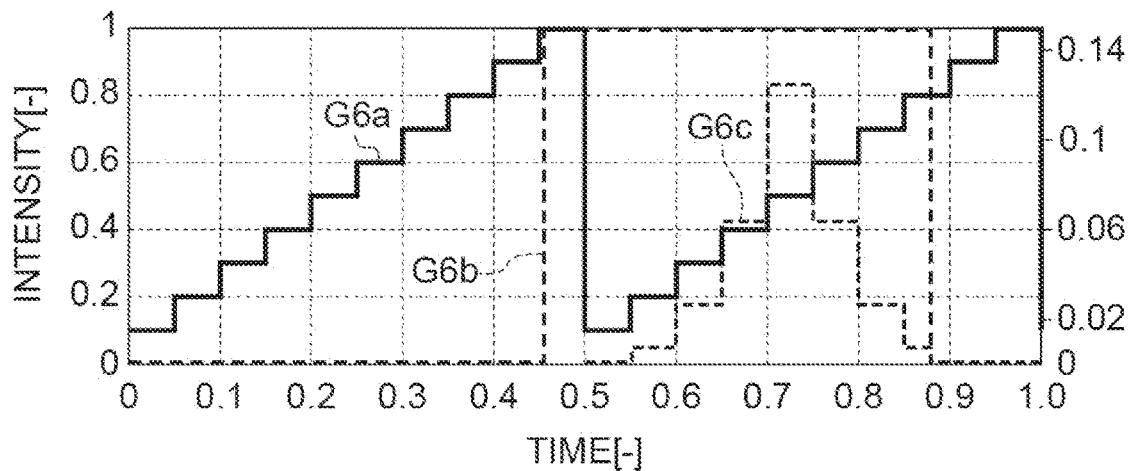

Next, the static magnetic field SM is generated (step S5). Specifically, the computer 10 outputs a control signal to control the intensity of the static magnetic field SM. A line G6a of FIG. 6A indicates one example of the intensity of the static magnetic field SM generated by the coil unit 6. In other words, the line G6a indicates one example of a control signal that is output to the coil power supply 13 by the coil control unit 10b. The horizontal axis of FIG. 6A represents time. The vertical axis of FIG. 6A represents the intensity of the static magnetic field SM. The intensity of the static magnetic field SM generated by the coil unit 6 is proportional to the magnitude of a current. Therefore, the vertical axis of FIG. 6A represents the magnitude of a current provided to the coil unit 6.

Next, the computer 10 controls the probe light source 4. As a result, the irradiation of the probe light LB is started (step S6). The signal output unit 5 outputs an output signal to the computer 10. The signal processing unit 10a of the computer 10 performs a process of visualizing the output signal, or the like.

Next, the computer 10 switches the intensity of the static magnetic field SM (step S7). As shown by the line G6a of FIG. 6A, the coil control unit 10b switches the intensity of the static magnetic field SM in a stepwise manner at constant time intervals (0.05). An increment in intensity of the static magnetic field SM is constant (0.1) in each of steps. Then, after the intensity of the static magnetic field SM reaches the maximum (1), the coil control unit 10b sets the intensity of the static magnetic field SM to a minimum value (0.1). The coil control unit 10b increases the intensity of the static magnetic field SM in a stepwise manner again. The coil control unit 10b repeats an operation of increasing the intensity of the static magnetic field SM from the minimum value (0.1) to the maximum value (1) in a step shape.

Figure 6B:
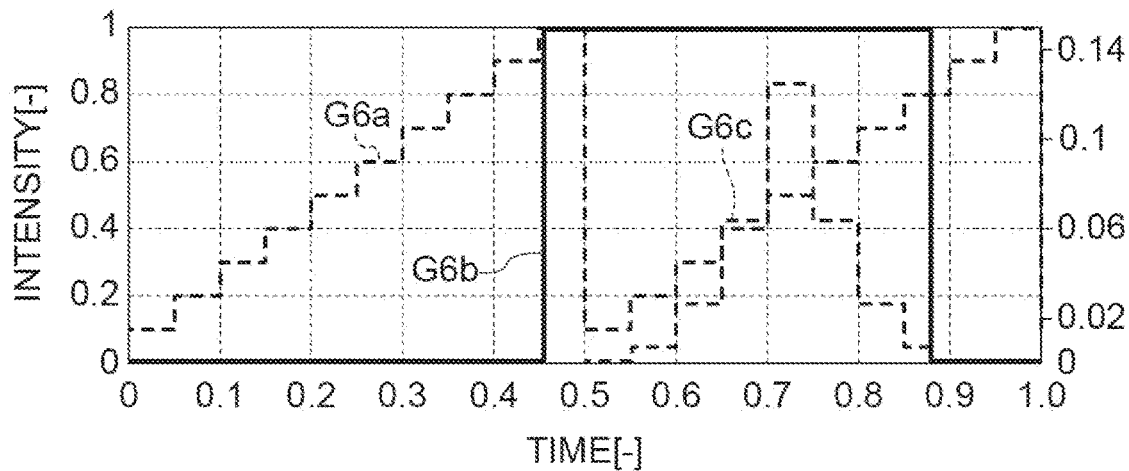
Figure 6B:
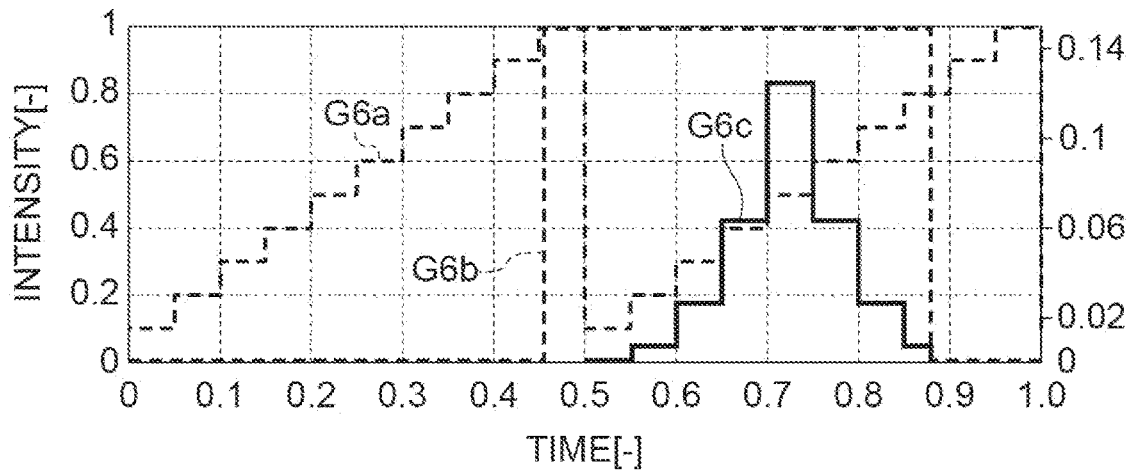

For example, it is assumed that a magnetic pulse is output from a measurement object. The magnetic pulse is shown by a line G6b of FIG. 6B. In FIG. 6B, only a time window in which the magnetic pulse is input is shown, and the intensity is set to a constant value. It is assumed that the frequency of the magnetic pulse is also unknown.

A line G6c of FIG. 6C indicates an output signal. In this situation, the coil control unit 10b increases the current. As a result, the intensity of the static magnetic field SM increases. When the intensity of the static magnetic field SM is 0.1, the intensity of the output signal is zero. Namely, when the intensity of the static magnetic field SM is 0.1, the Larmor frequency of precession significantly deviates from the frequency of the magnetic pulse. Therefore, the sensitivity is low. As a result, the magnetic pulse output from the measurement object does not appear in the output signal (refer to FIG. 4A). As the intensity of the static magnetic field SM increases gradually, the Larmor frequency also increases gradually. Then, when the static magnetic field SM has an intensity (0.5), the intensity of the output signal becomes the maximum. When the intensity of the static magnetic field SM is 0.5, the Larmor frequency of precession is closest to the frequency of the magnetic pulse.

Therefore, the sensitivity is high. As a result, the magnetic pulse output from the measurement object strongly appears in the output signal (refer to FIG. 4B).

The coil unit 6 of the optically pumped magnetometer 1 generates the static magnetic field SM. The frequency of precession of the atom 101 of the alkali metal which is vaporized by the heater 7 and is excited by the pump light LP is determined according to the intensity of the static magnetic field SM. As a result, a precession according to the first intensity is generated. Therefore, the magnetism corresponding to the frequency of the precession can be satisfactorily detected. The computer 10 switches the intensity of the static magnetic field SM from the first intensity to the second intensity. The frequency of the precession changes according to the second intensity. As a result, the magnetism which can be satisfactorily detected also changes. Therefore, the computer 10 switches the intensity of the static magnetic field SM, so that the frequency band of magnetism which can be satisfactorily detected can be switched. As a result, the measurable frequency band of magnetism can be expanded.

The optically pumped magnetometer and the magnetic sensing method of the present invention are not limited to the above aspects. For example, the history of the intensity of the static magnetic field SM applied to the cell 2 is not limited to the aspect shown in FIG. 6A.

First Modification Example

Figure 7A:
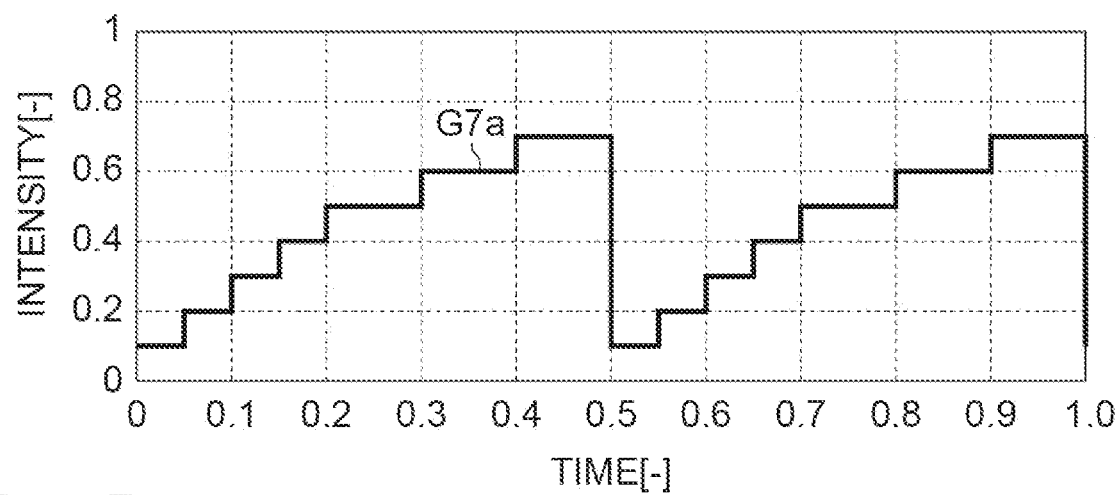
FIG. 7A is a graph for describing an operation of a optically pumped magnetometer of a first modification example.

In the example, the intensity of the static magnetic field SM is changed at constant time intervals. For example, as shown by a line G7a of FIG. 7A, the time interval at which the intensity of the static magnetic field SM is changed may not be constant. Switching between a first intensity (0.1), a second intensity (0.2), a third intensity (0.3), and a fourth intensity (0.4) is performed at a first time interval (0.05). Switching between the fourth intensity (0.4), a fifth intensity (0.5), a sixth intensity (0.6), and a seventh intensity (0.7) is performed at a second time interval (0.1). In the example of FIG. 7A, the second time interval is twice the first time interval. The measurable frequency band of magnetism can be also expanded by this control.

Second Modification Example

Figure 7B:
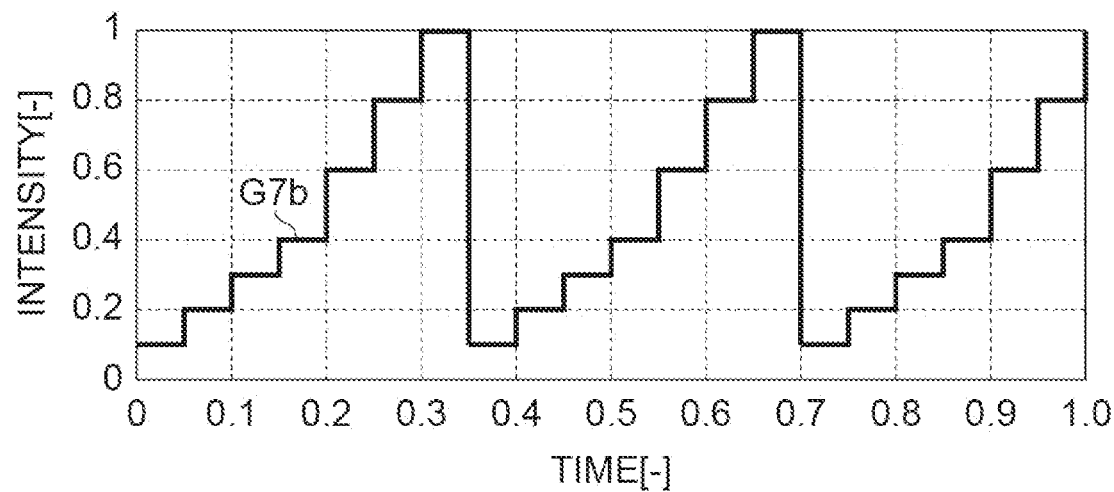
FIG. 7B is a graph for describing an operation of a optically pumped magnetometer of a second modification example.

As shown in FIG. 7B, the width of a change in intensity of the static magnetic field SM may not be constant. The width of a change from a first intensity (0.1), a second intensity (0.2), a third intensity (0.3), and a fourth intensity (0.4) is a first intensity width (0.1). The width of a change from the fourth intensity (0.4), a fifth intensity (0.6), a sixth intensity (0.8), and a seventh intensity (1) is a second intensity width (0.2). In the example of FIG. 7B, the second intensity width is twice the first intensity width. The measurable frequency band of magnetism can be also expanded by this control.

Incidentally, although illustration is omitted, the aspect in which the time interval is changed as described in the first modification example and the aspect in which the intensity width is changed as described in the second modification example may be combined.

Third Modification Example

Figure 8A:
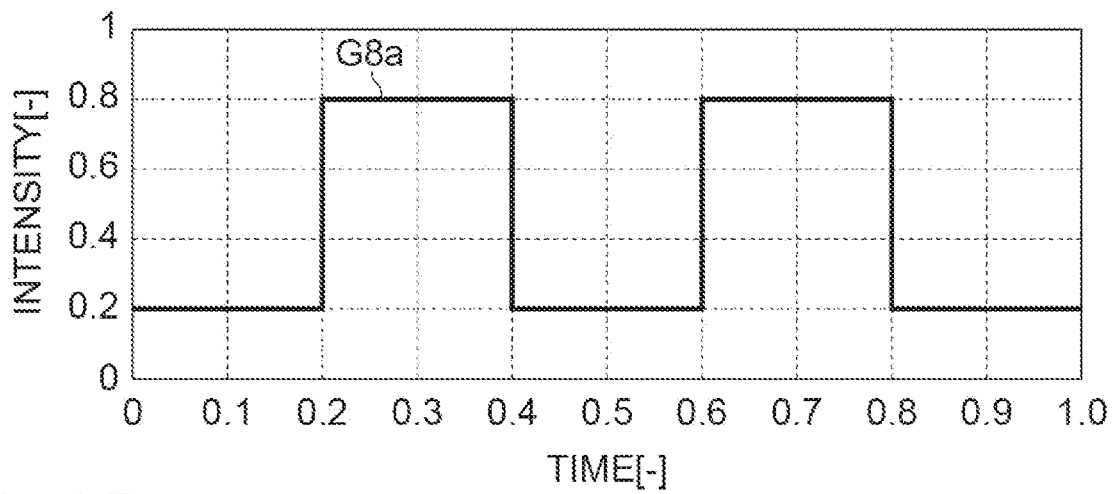
FIG. 8A is a graph for describing an operation of a optically pumped magnetometer of a third modification example.

As shown by a line G8a of FIG. 8A, the computer 10 may alternately switch the intensity of the static magnetic field SM, which is generated in the region of disposition of the cell 2, between a first intensity (0.2) and a second intensity (0.8). Specifically, the coil control unit 10b provides a first control signal in a first period to output a first current. The intensity of the static magnetic field SM is set to the first intensity by this control. Next, the coil control unit 10b provides a second control signal in a second period to output a second current. The intensity of the static magnetic field SM is switched to the second intensity by this control. In this case, it can be said that the intensity of the static magnetic field SM is changed in a rectangular wave shape. The measurable frequency band of magnetism can be also expanded by this control.

Fourth Modification Example

Figure 8B:
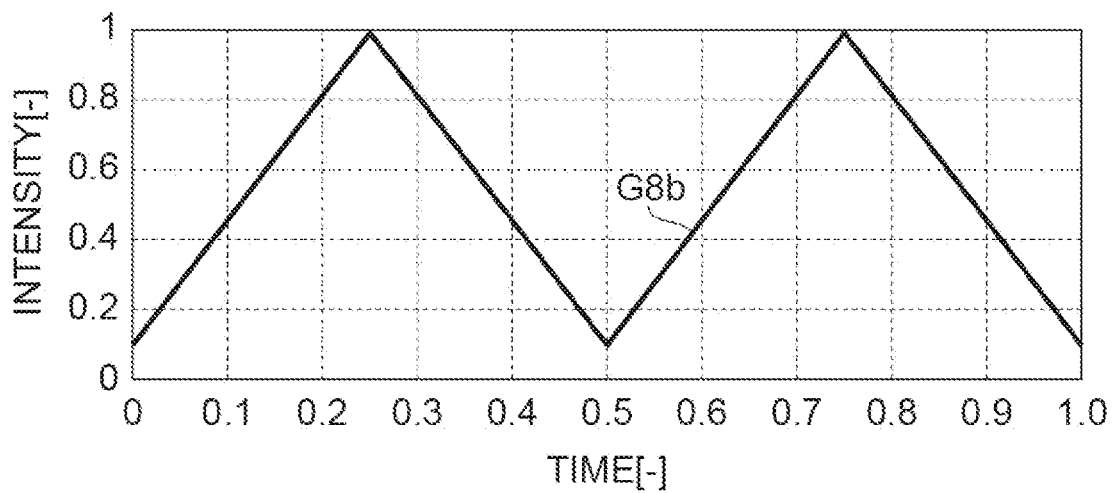
FIG. 8B is a graph for describing an operation of a optically pumped magnetometer of a fourth modification example.

In the example, the intensity of the static magnetic field SM is changed in a step shape. In other words, a change in intensity of the static magnetic field SM is discontinuous. For example, as shown by a line G8b of FIG. 8B, the computer 10 may continuously change the intensity of the static magnetic field SM. Specifically, the intensity of the static magnetic field SM is continuously changed from a first intensity (0.1) to a second intensity (1) over elapse of time. The change in intensity may be linear, which is expressed as a linear function as shown in FIG. 8B. In addition, the change in intensity may be curved, which is expressed as a quadratic function or the like. For example, the coil control unit 10b continuously increases the magnitude of a current provided to the coil unit 6. The intensity of the static magnetic field SM is continuously increased from the first intensity (0.1) to the second intensity (1) by this control. After the intensity of the static magnetic field SM reaches the second intensity (1), the intensity may continuously decrease to the first intensity (0.1). For example, the coil control unit 10b continuously decreases the magnitude of a current provided to the coil unit 6. The intensity of the static magnetic field SM is continuously decreased from the second intensity (1) to the first intensity (0.1) by this control. Namely, the intensity of the static magnetic field SM is increased from the first intensity (0.1) to the second intensity (1), and then is decreased from the second intensity (1) to the first intensity (0.1). This operation may be repeated as one unit. In this case, it can be said that the intensity of the static magnetic field SM is changed in a triangular wave shape. The measurable frequency band of magnetism can be also expanded by this control.

Fifth Modification Example

Figure 8C:
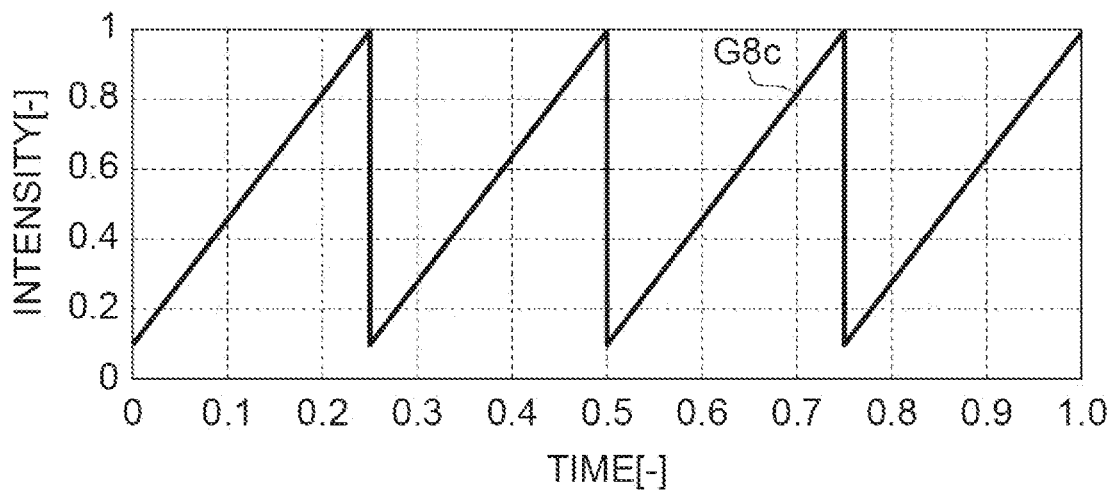
FIG. 8C is a graph for describing an operation of a optically pumped magnetometer of a fifth modification example.

In an aspect in which the intensity of the static magnetic field SM is continuously changed, as shown by a line G8c of FIG. 8C, an operation of increasing the intensity of the static magnetic field SM from a first intensity (0.1) to a second intensity (1) may be repeated as one unit. In this case, it can be said that the intensity of the static magnetic field SM is changed in a sawtooth wave shape. The measurable frequency band of magnetism can be also expanded by this control.

Sixth Modification Example

Figure 9:
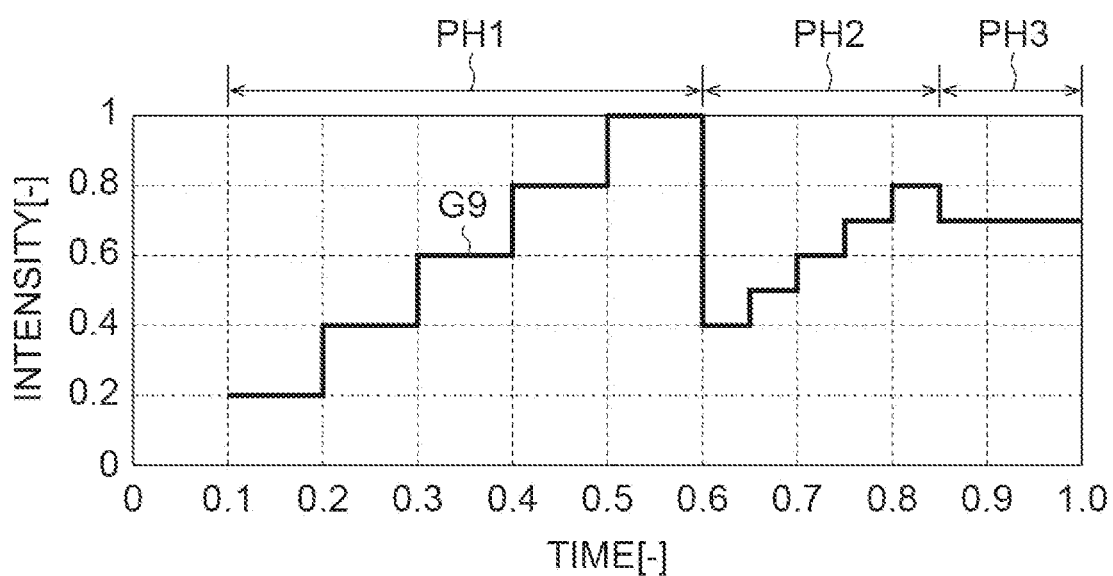
FIG. 9 is a graph for describing an operation of a optically pumped magnetometer of a sixth modification example.

As shown in FIG. 9, the computer 10 may set the intensity of the static magnetic field SM based on a result of measurement. The range in which the intensity is changed may be limited in a stepwise manner while attention is paid to a state where a magnetic field pulse is detected. Specifically, the computer 10 changes the intensity of the static magnetic field SM from a first intensity (0.2) to a fifth intensity (1) as a first phase PH1. The computer 10 repeats the first phase PH1 until the magnetic pulse is detected. The computer 10 determines whether or not an output signal contains a signal component indicating the magnetic pulse. For example, as a result of the determination, it is assumed that the magnetic pulse is detected at a third intensity (0.6). Then, the computer 10 proceeds to a second phase PH2. The computer 10 makes the width of a change in intensity in the second phase PH2 narrower than the width of a change in intensity in the first phase PH1. For example, regarding the intensity of the static magnetic field SM, a second intensity (0.4) is the minimum and a fourth intensity (0.8) is the maximum with a third intensity (0.6) centered. Then, the width of a change in intensity is set to be smaller than the width of the change in intensity in the first phase PH1. For example, the width of a change in intensity is set to ½ of that in the first phase PH1. Then, in the second phase PH2, the magnetic pulse is further detected. Similar to the first phase PH1, the second phase PH2 may be also repeatedly performed until a predetermined condition is satisfied. It is assumed that a magnetic pulse of interest is detected at an intermediate intensity (0.7) between the third intensity (0.6) and the fourth intensity (0.8). The computer 10 further proceeds to a third phase PH3. In the third phase PH3, the computer 10 sets the intensity of the static magnetic field SM to an intermediate intensity (0.7) between the fourth intensity and the fifth intensity. In the third phase PH3, it can be said that the most suitable condition where the magnetic pulse is obtained is clarified. Therefore, the intensity of the static magnetic field SM may not be changed. The measurable frequency band can be also expanded by this control. Further, the accuracy of measurement of the magnetic pulse of interest can be also improved.

First Example

Figure 10A:
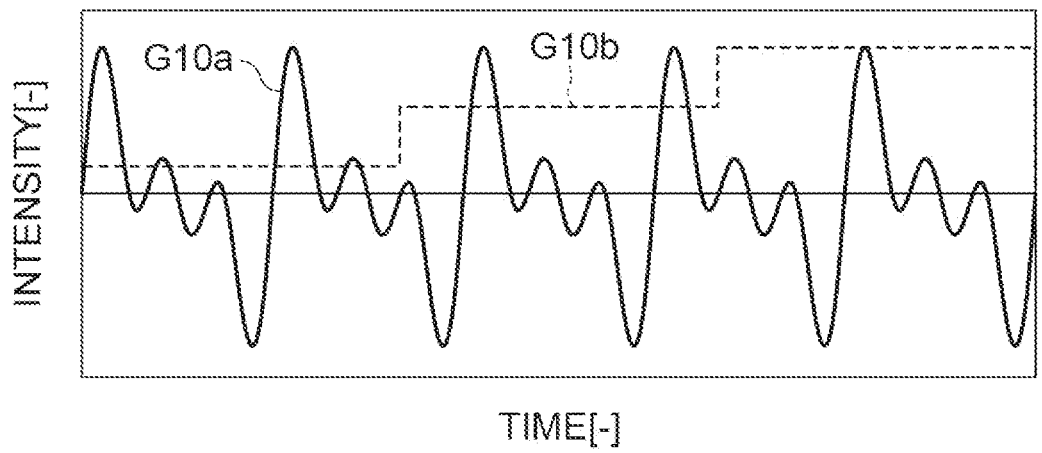
FIGS. 10A, 10B, and 10C are graphs showing results of a first example.
Figure 10B:
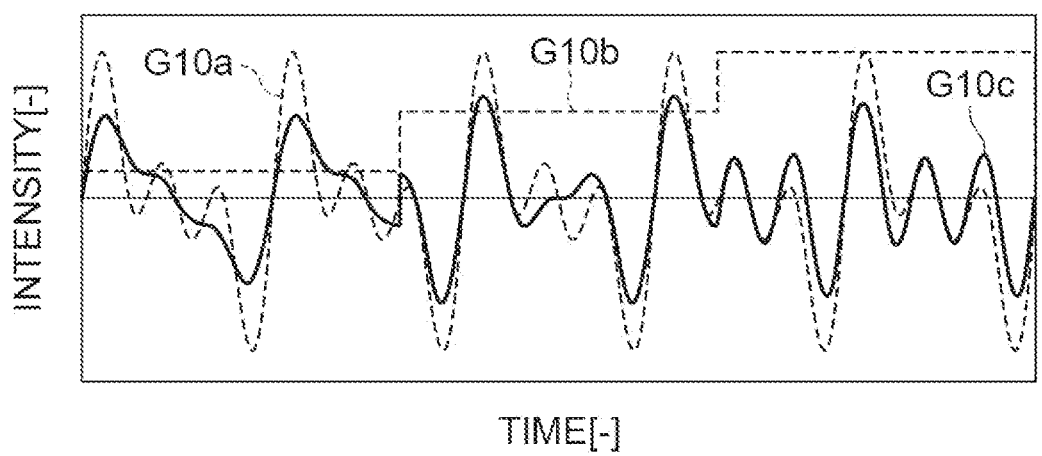
Figure 10C:
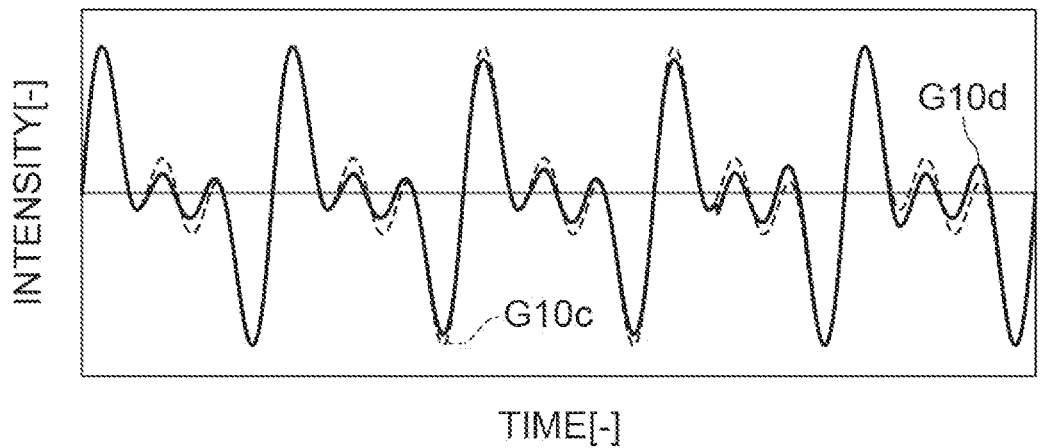

In a first example, an input signal G10a (FIG. 10A) containing three frequency components was set. Next, an output signal G10c (FIG. 10B) was obtained by changing an intensity G10b of the static magnetic field SM in three steps. Further, the output signal G10c was corrected with a magnification, which was obtained from a frequency response characteristic, to obtain a corrected output signal G10d (FIG. 10C). The output signal G10c for the input signal G10a shown a different waveform whenever the intensity G10b of the static magnetic field SM was changed. It was seen that the time of the peak of the output signal G10c corresponded to the time of the input signal G10a. However, the intensity of the peak of the output signal G10c deviated from the intensity of the input signal G10a. Therefore, Fourier transform was performed on the output signal G10c to decompose the output signal G10c into frequency components. Then, each of the frequency components was corrected. The magnification obtained from the frequency response characteristic (refer to FIG. 3) was used for the correction. As a result, as shown by the corrected output signal G10d, a waveform that could be regarded as being substantially equivalent to the input signal G10a could be restored.

Second Example

Figure 11A:
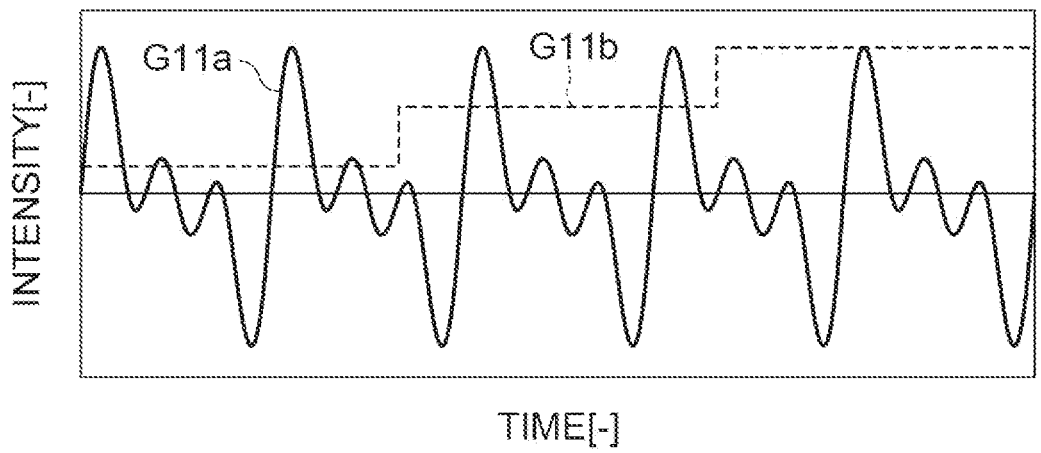
FIGS. 11A, 11B, and 11C are graphs showing results of a second example.
Figure 11B:
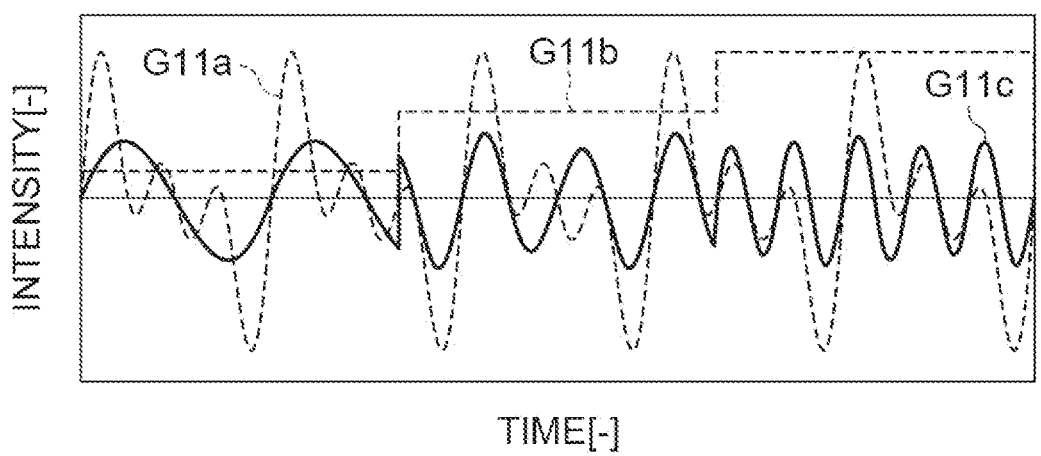
Figure 11C:
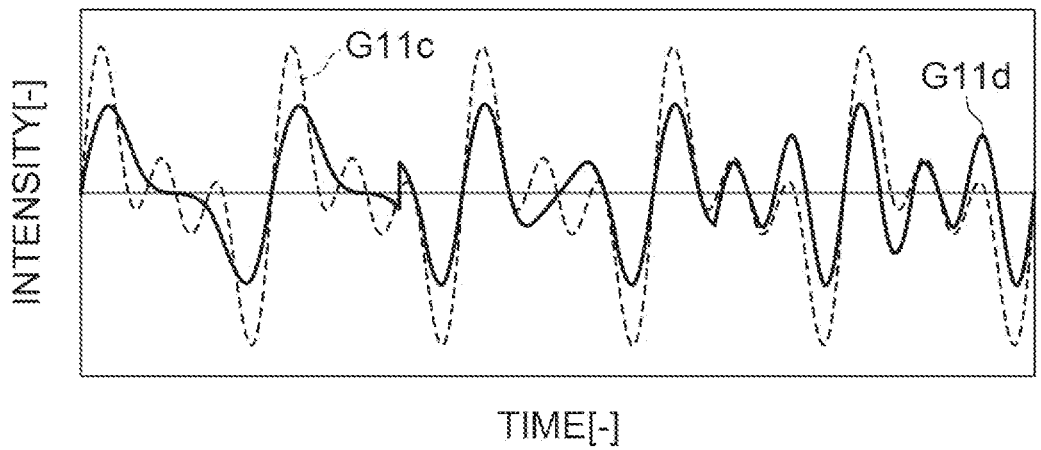

In a second example, when the deviation between a frequency component containing an input signal G11a (FIG. 11A) and a resonant frequency based on the intensity of the static magnetic field SM was large, an output signal G11c (FIG. 11B) and a corrected output signal G11d (FIG. 11C)

were confirmed. The flow of a process of obtaining the output signal G11c and the corrected output signal G11d is the same as that in the first example. As a result, when the deviation between the frequency of the input signal G11a and the resonant frequency was very large, almost no component corresponding to the input signal G11a could be detected in the output signal G11c. However, a signal corresponding to the input signal G11a to some extent could be obtained by changing the intensity of the static magnetic field SM and performing correction.

What is claimed is:

1. A optically pumped magnetometer comprising:
a cell filled with an alkali metal;
a first light source that generates a pump light to excite an atom of the alkali metal;
a second light source that generates a probe light to detect a desired characteristic of the atom in an excited state;
a signal output unit that obtains an output signal related to magnetism, which is received by the cell, based on the probe light which has passed through the cell;
a static magnetic field generating unit that generates a static magnetic field along an optical axis of the first light source in a region in which the cell is disposed; and
a control unit that controls operation of the static magnetic field generating unit,
wherein the control unit performs an operation of providing the static magnetic field generating unit with a first control signal and receiving a first output signal from the signal output unit based on the probe light which has passed through the cell, and an operation of providing the static magnetic field generating unit with a second control signal and receiving a second output signal from the signal output unit based on the probe light which has passed through the cell,
wherein the first control signal generates a first static magnetic field having a first intensity in the region in which the cell is disposed, and the second control signal generates a second static magnetic field having a second intensity different from the first intensity in the region in which the cell is disposed, and
wherein the atom of the alkali metal cell with which the cell is filled is in a state of having a first Larmor frequency caused by the static magnetic field having the first intensity in the first static magnetic field, and is in a state of having a second Larmor frequency caused by the static magnetic field having the second intensity in the second static magnetic field, the second Larmor frequency being different from the first Larmor frequency.

2. The optically pumped magnetometer according to claim 1,
wherein the control unit repeats an operation of outputting the second control signal after outputting the first control signal.

3. The optically pumped magnetometer according to claim 1,
wherein the control unit outputs a third control signal to set the intensity of the static magnetic field to a third intensity different from the first intensity and the second intensity, and
the control unit repeats an operation of outputting the first control signal, the second control signal, and the third control signal in order.

4. The optically pumped magnetometer according to claim 1,
wherein the control unit outputs a third control signal to set the intensity of the static magnetic field to a third intensity different from the first intensity and the second intensity, and
the control unit repeats an operation of outputting the first control signal, the second control signal, the third control signal, the second control signal, and the first control signal in order.

5. The optically pumped magnetometer according to claim 1,
wherein the control unit repeats a first operation of determining whether or not the output signal which is obtained in a state where the first control signal is output contains a signal component indicating a magnetic pulse, and a second operation of determining whether or not the output signal which is obtained in a state where the second control signal is output contains a signal component indicating a magnetic pulse, and
when in the first operation, the output signal contains the signal component indicating the magnetic pulse, the first operation is continued without switching from the first operation to the second operation, and when in the second operation, the output signal contains the signal component indicating the magnetic pulse, the second operation is continued without switching from the second operation to the first operation.

6. A magnetic sensing method comprising:
a step of irradiating a cell, which is filled with an alkali metal, with a pump light to excite an atom of the alkali metal, and irradiating the cell with a probe light to detect a desired characteristic of the atom in an excited state;
a first signal acquisition step of acquiring an output signal based on the probe light which has passed through the cell in a state where a static magnetic field having a first intensity is generated in a region in which the cell is disposed; and
a second signal acquisition step of acquiring an output signal based on the probe light which has passed through the cell in a state where a static magnetic field having a second intensity different from the first intensity is generated in the region in which the cell is disposed,
wherein in the first signal acquisition step, a first static magnetic field having a first intensity is generated in the region in which the cell is disposed,
wherein in the second signal acquisition step, a second static magnetic field having a second intensity different from the first intensity is generated in the region in which the cell is disposed, and
wherein the atom of the alkali metal with which the cell is filled is in a state of having a first Larmor frequency caused by the static magnetic field having the first intensity in the first static magnetic field, and is in a state of having a second Larmor frequency caused by the static magnetic field having the second intensity in the second static magnetic field, the second Larmor frequency being different from the first Larmor frequency.

7. A optically pumped magnetometer comprising:
a cell filled with an alkali metal;
a first light source that generates a pump light to excite an atom of the alkali metal;
a second light source that generates a probe light to detect a desired characteristic of the atom in an excited state;

a signal output unit that obtains an output signal related to magnetism, which is received by the cell, based on the probe light which has passed through the cell;

a static magnetic field generating unit that generates a static magnetic field along an optical axis of the first light source in a region in which the cell is disposed; and a control unit that controls operation of the static magnetic field generating unit, wherein the control unit repeats an operation of providing the static magnetic field generating unit with a first control signal and receiving a first output signal from the signal output unit based on the probe light which has passed through the cell, an operation of providing the static magnetic field generating unit with a second control signal and receiving a second output signal from the signal output unit based on the probe light which has passed through the cell, and an operation of providing the static magnetic field generating unit with a third control signal and receiving a third output signal from the signal output unit based on the probe light which has passed through the cell, and wherein the first control signal generates a first static magnetic field having a first intensity in the region in which the cell is disposed, the second control signal generates a second static magnetic field having a second intensity different from the first intensity in the region in which the cell is disposed, and the third control signal generates a third static magnetic field having a third intensity different from the first intensity and the second intensity in the region in which the cell is disposed.

8. A optically pumped magnetometer comprising:

a cell filled with an alkali metal;

a first light source that generates a pump light to excite an atom of the alkali metal;

a second light source that generates a probe light to detect a desired characteristic of the atom in an excited state;

a signal output unit that obtains an output signal related to magnetism, which is received by the cell, based on the probe light which has passed through the cell;

a static magnetic field generating unit that generates a static magnetic field along an optical axis of the first light source in a region in which the cell is disposed; and a control unit that controls operation of the static magnetic field generating unit, wherein the control unit repeats a first operation of providing the static magnetic field generating unit with a first control signal and receiving a first output signal from the signal output unit based on the probe light which has passed through the cell to determine whether or not the first output signal contains a signal component indicating a magnetic pulse, and a second operation of providing the static magnetic field generating unit with a second control signal and receiving a second output signal from the signal output unit based on the probe light which has passed through the cell to determine whether or not the second output signal contains a signal component indicating a magnetic pulse, and when in the first operation, the first output signal contains the signal component indicating the magnetic pulse, the first operation is continued without switching from the first operation to the second operation, and when in the second operation, the second output signal contains the signal component indicating the magnetic pulse, the second operation is continued without switching from the second operation to the first operation.

* * * * *